(12) United States Patent
Lee et al.

(10) Patent No.: US 11,808,816 B2
(45) Date of Patent: Nov. 7, 2023

(54) SYSTEM FOR OBTAINING BATTERY STATE INFORMATION

(71) Applicant: MINTECH CO., LTD, Daejeon (KR)

(72) Inventors: Young Jae Lee, Daejeon (KR); Hee Kyung Myung, Daejeon (KR); Seong Joon Hong, Daejeon (KR)

(73) Assignee: MINTECH CO., LTD, Daejeon (KR)

( * ) Notice: Subject to any disclaimer, the term of this patent is extended or adjusted under 35 U.S.C. 154(b) by 307 days.

(21) Appl. No.: 17/273,182

(22) PCT Filed: Sep. 4, 2019

(86) PCT No.: PCT/KR2019/011369
§ 371 (c)(1),
(2) Date: Mar. 3, 2021

(87) PCT Pub. No.: WO2020/050606
PCT Pub. Date: Mar. 12, 2020

(65) Prior Publication Data
US 2021/0325472 A1    Oct. 21, 2021

(30) Foreign Application Priority Data

Sep. 5, 2018 (KR) .................. 10-2018-0105881
Sep. 5, 2018 (KR) .................. 10-2018-0105884

(51) Int. Cl.
| | |
|---|---|
| *G01R 31/389* | (2019.01) |
| *G01R 31/3835* | (2019.01) |
| *B60R 16/02* | (2006.01) |
| *B60R 16/023* | (2006.01) |
| *G01K 13/00* | (2021.01) |

(Continued)

(52) U.S. Cl.
CPC .......... *G01R 31/389* (2019.01); *B60R 16/023* (2013.01); *B60R 16/0207* (2013.01); *G01K 13/00* (2013.01); *G01R 31/1263* (2013.01); *G01R 31/3835* (2019.01);
(Continued)

(58) Field of Classification Search
None
See application file for complete search history.

(56) References Cited

U.S. PATENT DOCUMENTS

| | | |
|---|---|---|
| 10,075,004 B2 | 9/2018 | Yang et al. |
| 2008/0042615 A1* | 2/2008 | Serrels ............... H02J 7/00306 320/101 |

(Continued)

FOREIGN PATENT DOCUMENTS

| | | |
|---|---|---|
| JP | 2011-018532 | 1/2011 |
| KR | 10-1160545 | 6/2012 |

(Continued)

*Primary Examiner* — Jas A Sanghera
(74) *Attorney, Agent, or Firm* — Maschoff Brennan

(57) ABSTRACT

A system for obtaining state information of a battery may be disclosed. The system includes: at least one first harness cable for obtaining, on the basis of a CAN protocol, data indicating state information of the battery from a battery management system of the battery; an analyzer for providing a driving signal for driving the battery management system; and a first junction box for transmitting the data input through the first harness cable to the analyzer, wherein the analyzer may be configured to output the data received from the first junction box to the outside.

18 Claims, 9 Drawing Sheets

(51) Int. Cl.
*G01R 31/12* (2020.01)
*H02J 7/00* (2006.01)
*B60L 58/12* (2019.01)
*B60L 58/16* (2019.01)
*B60L 58/24* (2019.01)

(52) U.S. Cl.
CPC ............ *H02J 7/0047* (2013.01); *B60L 58/12* (2019.02); *B60L 58/16* (2019.02); *B60L 58/24* (2019.02)

(56) References Cited

U.S. PATENT DOCUMENTS

| | | | | |
|---|---|---|---|---|
| 2014/0002021 | A1* | 1/2014 | Bertness | ............... B60L 1/02 |
| | | | | 320/109 |
| 2015/0291111 | A1* | 10/2015 | Suzuki | ............... B60L 58/24 |
| | | | | 307/10.1 |
| 2017/0033735 | A1* | 2/2017 | Tsuda | ............... H02S 50/00 |

FOREIGN PATENT DOCUMENTS

| | | |
|---|---|---|
| KR | 10-2015-0104669 | 9/2015 |
| KR | 10-2017-0035229 | 3/2017 |
| KR | 10-2017-0060882 | 6/2017 |
| KR | 10-2017-0067322 | 6/2017 |
| KR | 10-2018-0084523 | 7/2018 |
| KR | 10-1974015 | 5/2019 |
| KR | 10-2000993 | 7/2019 |

\* cited by examiner

SYSTEM FOR OBTAINING BATTERY STATE INFORMATION

TECHNICAL FIELD

Embodiments of the present disclosure relate to a system including electronic devices, and more particularly, to a system for obtaining battery state information.

BACKGROUND ART

As the demand for automobiles and other portable electronic devices increases, batteries such as secondary batteries are widely used as power sources for these devices. In particular, lithium-ion batteries are widely used due to their high energy density, high operating voltage, relatively large charging capacity, and convenient portability as compared to conventional batteries.

As such batteries are continuously charged and discharged, durability thereof is reduced, and there is a risk of accidents such as explosion. In addition, as charging and discharging are repeated, there is a problem in that the charging capacity decreases, thereby reducing the use time. In order to address such problems, it is necessary to predict abnormality and life span of the battery by obtaining state information such as temperature and voltage of the battery.

DETAILED DESCRIPTION OF THE INVENTION

Technical Objectives

Aspects of embodiments of the present invention are direct to a system for measuring state information of a battery.

The technical problem to be achieved by the present disclosure is not limited to the technical problem as described above, and other technical problems may be inferred from the following embodiments.

Means to Solve the Problem

According to an embodiment, a system for obtaining state information of a battery includes: at least one first harness cable configured to obtain data indicating state information of the battery from a battery management system of the battery; an analyzer configured to provide a driving signal for driving the battery management system; and a first junction box configured to transmit the data input through the first harness cable to the analyzer, wherein the analyzer is configured to output the data received from the first junction box to the outside.

In some embodiments, the system may further include a power supply connected to the first junction box to supply a power to the battery management system.

In some embodiments, the state information of the battery may include at least one of voltage, temperature, state of charge (SoC), state of health (SoH), state of power (SoP), state of energy (SoE), and state of balance (SoB) of the battery.

In some embodiments, the system may further include: an alternating current (AC) impedance analyzer configured to detect an AC impedance of the battery and, a second junction box connected through at least one second harness cable to the battery, the second junction box including a circuit configured to allow the AC impedance analyzer to detect the AC impedance.

In some embodiments, the AC impedance analyzer may measure an AC impedance of the battery in a fully charged state, an AC impedance of the battery in a fully discharged state, and an AC impedance of the battery in a partially charged or partially discharged state.

In some embodiments, the AC impedance analyzer may measure the AC impedance by measuring at least one of a resistance, an inductance, and a capacitance at a reference frequency or within a reference frequency range.

In some embodiments, the AC impedance analyzer may measure the AC impedance by measuring at least one of a resistance, an inductance, and a capacitance at a reference frequency or within a reference frequency range, and configuring an equivalent circuit corresponding to the measured resistance, inductance, and capacitance.

In some embodiments, the AC impedance analyzer may output information on the AC impedance to the outside based on a TCP/IP.

In some embodiments, the system may further include: a charge/discharge apparatus configured to charge or discharge the battery, wherein the charge/discharge apparatus is connected to the battery through the second junction box.

In some embodiments, the system may further include: an insulation resistor configured to measure an insulation resistance of the battery, wherein the insulation resistor is connected to the battery through the second junction box.

In some embodiments, the system may further include: a voltage meter configured to measure a voltage of the battery, wherein the voltage meter is connected to the battery through the second junction box.

In some embodiments, at least one of the first junction box and the second junction box may include a temperature sensor configured to measure a temperature inside the first junction box.

In some embodiments, the analyzer may output the data based on a control area network (CAN) protocol.

According to another embodiment, a system for obtaining state information of a battery includes: at least one first harness cable connected to the battery and configured to obtain at least one signal indicating the state information; a first junction box including at least one fuse allowing the at least one signal input through the first harness cable to pass through, the first junction box configured to output the at least one signal having passed through the fuse; and an interface device configured to convert the at least one signal input from the first junction box into at least one digital data and output the at least one converted digital data to the outside.

In some embodiments, the state information may include at least one of voltage information and temperature information of the battery, and the signal may include at least one of a first signal indicating the voltage information and a second signal indicating the temperature information.

In some embodiments, the battery may include a plurality of modules, and the at least one first harness cable may include a plurality of harness cables configured to obtain a plurality of signals indicating the state information for the plurality of modules from the plurality of modules, respectively.

In some embodiments, the interface device may include: input ports configured to receive the plurality of signals from the first junction box, respectively; and at least one analog-digital converter configured to convert the plurality of signals into the at least one digital data, respectively.

In some embodiments, the interface device may output the at least one digital data based on a control area network (CAN) protocol, the system further including: a first LED indicating a communication state based on the CAN protocol; and a second LED indicating an operation state of the at least one analog-digital converter.

In some embodiments, the at least one fuse may be configured to protect the interface device from a short circuit resulting from the at least one signal.

In some embodiments, the first junction box may include: a plurality of input ports connected to the plurality of harness cables to receive the plurality of signals, respectively; and a plurality of output ports configured to output the plurality of signals to the interface device, respectively.

In some embodiments, one end of the at least one first harness cable may include a first connector for connection with the battery and another end thereof includes a second connector for connection with the first junction box, and at least one of the first connector and the second connector may be attached with a protective cap for safety.

In some embodiments, the system may further include: a second junction box connected to the battery through at least one second harness cable; and an AC impedance analyzer configured to detect an AC impedance of the battery through the second junction box, wherein the second junction box may include a circuit configured to detect the AC impedance.

In some embodiments, the system may further include: an insulation resistor configured to measure an insulation resistance of the battery; and a voltage meter configured to measure a voltage of the battery, wherein the insulation resistor and the voltage meter are connected to the battery through the second junction box.

Effects of the Invention

According to one or more embodiments of the present disclosure, a system may efficiently and accurately obtain battery state information and provide the obtained information to an external diagnosis device.

In addition, according to one or more embodiments of the present disclosure, a system may efficiently and accurately diagnose state of a battery even when a battery management system (BMS) is not operating or is unavailable.

DETAILED DESCRIPTION

Hereinafter, some embodiments will be described clearly in detail with reference to the accompanying drawings so that those with ordinary knowledge in the technical field to which the present invention pertains (hereinafter, ordinary technicians) may easily implement the present invention.

Figure 1:
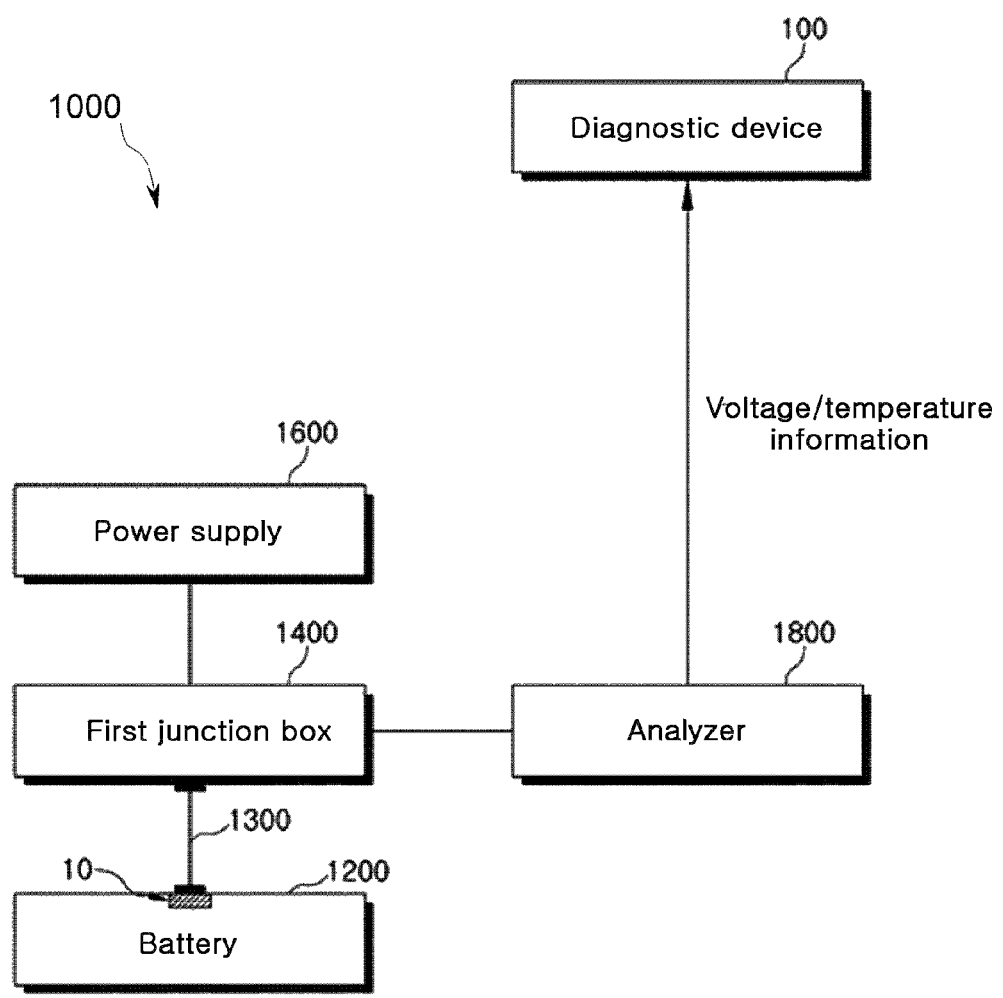
FIG. 1 is a block diagram illustrating a system according to an embodiment.

FIG. 1 is a block diagram illustrating a system for obtaining state information of a battery according to an embodiment.

Referring to FIG. 1, a system 1000 may include a battery 1200, a first junction box 1400, a power supply 1600, and an analyzer 1800.

The battery 1200 may refer to one battery cell or a module in which a plurality of battery cells are electrically connected to each other. In addition, the battery 1200 may include a plurality of battery modules. Each of the plurality of battery modules may include a plurality of cells. The plurality of battery modules may be connected mixedly in series and parallel. According to an embodiment, the plurality of battery modules may be secondary batteries such as lithium ion batteries. In addition, capacities of the plurality of battery modules may be substantially the same as or different from each other.

The battery 1200 may be a battery for an electric vehicle (EV). In such an embodiment, the battery 1200 may have a different shape, structure, number of cells, or a pin-map depending on the vehicle type. According to an embodiment, the battery 1200 may be composed of 6 modules, and each module may include 20 cells. According to another embodiment, the battery 1200 may be configured as one module including 20 cells.

According to an embodiment, the battery 1200 may include a battery management system (BMS). The battery management system (BMS) serves to improve energy efficiency and extend life span by optimally managing the battery 1200. For example, the battery management system BMS may monitor voltage, current, and temperature of the battery 1200 in real time to substantially prevent excessive charging or discharging in advance and increase the safety and reliability of the battery 1200. The battery management system (BMS) is a device that measures voltage, current, and temperature in the battery 1200 and may serve to monitor state (or status) of the battery such as charge capacity and life and send a control signal to a switch to shut off power before a dangerous situation occurs due to overcharge, discharge, or voltage fluctuation. Accordingly, the battery management system (BMS) may manage various data (voltage, current, temperature, etc.) related to the state of the battery 1200 and may output data to the outside through a predetermined communication protocol (for example, WiFi, Bluetooth, Code Division Multiple Access (CDMA), or Control Area Network (CAN) protocol).

The first junction box 1400 may be connected to the battery management system (BMS) 10 through a harness cable 1300. The first junction box 1400 may receive various data related to the state of the battery 1200 from the battery management system (BMS) 10 through the harness cable 1300 based on a predetermined communication protocol such as Wi-Fi, Bluetooth, CDMA, and CAN protocol. Data received by the first junction box 1400 may be transmitted to the analyzer 1800. The first junction box 1400 may be configured as a communication circuit which connects the battery management system (BMS) 10 and the analyzer 1800 for data transfer therebetween. The analyzer 1800 may supply a driving signal for the battery management system (BMS) through the first junction box 1400 or receive data related to the battery state information received from the battery management system (BMS) 10 through the first junction box 1400. To this end, a circuit for transmitting a command to the battery management system (BMS) 10 or receiving data from the battery management system (BMS) 10 may be included. The analyzer 1800 may transmit data to a diagnosis device 100 based on a predetermined communication protocol such as Wi-Fi, Bluetooth, CDMA, and CAN protocol. For example, the analyzer 1800 may be a control area network (CAN protocol) analyzer.

In addition, the first junction box 1400 may connect the battery management system (BMS) 10 and the power supply 1600 so that a power of the power supply 1600 may be supplied to the battery management system (BMS) 10. The power supply 1600 may supply the power to the battery management system (BMS) 10 of the battery 1200 through the first junction box 1400. To this end, the power supply 1600 may be electrically connected to the battery management system (BMS) 10. The power supply 1600 may control the battery 1200 and obtain information relevant to the battery by supplying power (e.g., DC 12 V) to the battery management system (BMS) 10 to drive the battery management system (BMS) 10. According to an embodiment, the power supply 1600 may be a device configured to receive an external power and then convert the external power to voltage and current required by the battery management system (BMS) 10 to supply it to the battery management system (BMS) 10.

According to an embodiment, the first junction box 1400 may include a temperature sensor. For example, the first junction box 1400 may be configured so that when an internal temperature of the first junction box 1400 rises above a temperature preset through an external display, a user may recognize it through an alarm.

Figure 2:
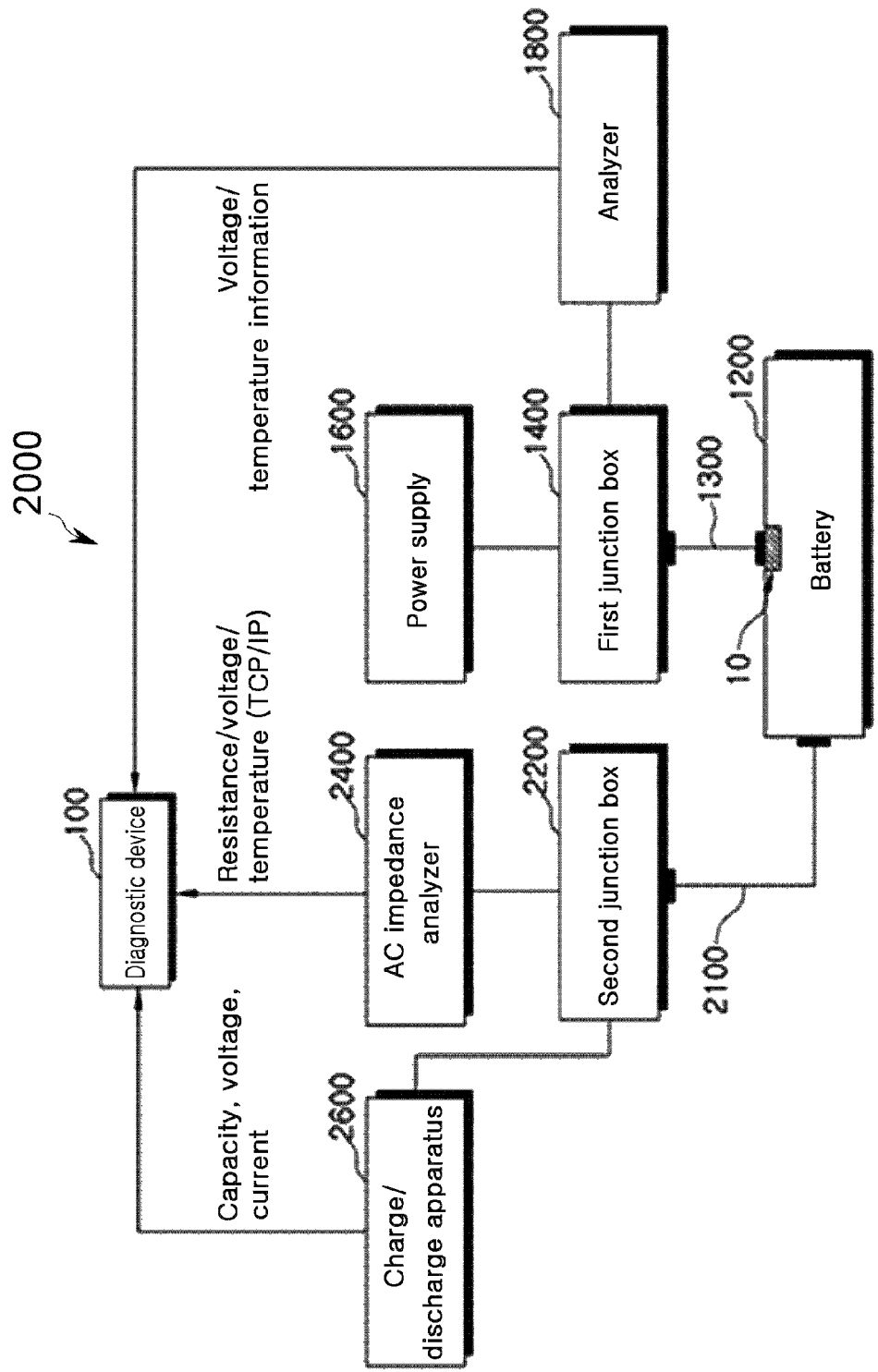
FIG. 2 is a detailed block diagram illustrating a system according to an embodiment.

FIG. 2 is a detailed block diagram illustrating a system for obtaining state information of a battery according to an embodiment.

Since a system 2000 of FIG. 2 illustrates a specific embodiment of the system 1000 of FIG. 1, the description of the system 1000 of FIG. 1 may also be applicable to the system 2000 of FIG. 2.

Referring to FIG. 2, the system 2000 may further include a second junction box 2200, an alternating current (AC) impedance analyzer 2400, and a charge/discharge apparatus 2600.

The AC impedance analyzer 2400 may detect an AC impedance of the battery 1200. For example, the AC impedance analyzer 2400 may be connected to a terminal of the battery 1200 through the second junction box 2200 to detect the AC impedance of the battery 1200.

The AC impedance analyzer 2400 may detect at least one of a resistance R, an inductance L, and a capacitance C (e.g., resistor, inductor, and capacitor) of the battery 1200 at a reference frequency or within a reference frequency range to detect an AC impedance of the battery. In such an embodiment, the AC impedance of the battery may be detected by measuring at least one of the resistance R, the inductance L and the capacitance C and then forming an equivalent circuit.

The AC impedance analyzer 2400 may include a configuration for measuring a resistance, an inductance, and a capacitance, and an operation processing circuit or apparatus for calculating an impedance value using the same.

In addition, according to an embodiment, the AC impedance analyzer 2400 may further include a temperature measurer (not illustrated) that measures a temperature of the battery 1200.

The AC impedance analyzer 2400 may measure a temperature of the battery 1200 through a temperature measurer (not illustrated) and may detect the AC impedance in consideration of battery temperature dependence.

In one embodiment, when measured by the AC impedance analyzer 2400, a voltage may be in a range from 5 to 500 V, a resistance may be in a range from 100 μΩ to 1Ω, a frequency may be in a range from 1 Hz to 1 kHz, and a temperature may be in a range from −40 to 80° C.

The AC impedance analyzer 2400 may detect the AC impedance of the battery in various states. Specifically, the AC impedance analyzer 2400 may detect an AC impedance for the battery in a fully charged state, an AC impedance for the battery in a fully discharged state, and an AC impedance for the battery in a partially charged and discharged state.

The charge/discharge apparatus 2800 may charge or discharge the battery 1200. The charge/discharge apparatus 2800 may charge or discharge the battery 1200 to make the battery 1200 in a fully charged state, a fully discharged state, or a partial charged state. According to an embodiment, the charge/discharge apparatus 2800 may further include a temperature measurer (not illustrated) that measures the temperature of the battery 1200. By measuring the temperature of the battery 1200 by the temperature measurer, the AC impedance analyzer 2400 may detect the AC impedance of the battery 1200 in various states in consideration of battery temperature dependence.

Information on the resistance R, inductance L, capacitance C, voltage, temperature, and AC impedance measured and detected by the AC impedance analyzer 2400 may be transmitted to the diagnosis device 100. According to an embodiment, the AC impedance analyzer 2400 may transmit battery state information to the diagnosis device 100 based on a Transmission Control Protocol/Internet Protocol (TCP/IP). According to an embodiment, the diagnosis device 100 may analyze the resistance R, the inductance L, the capacitance C, and the AC impedance received from the AC impedance analyzer 2400 to diagnose the state of the battery 1200 such as State of Charge (SoC), State of Health (SoH), State of Power (SoP), State of Energy (SoE), and State of Balance (SoB), and to this end, may include at least one processor.

The second junction box 2200 may be connected to the battery 1200 through a harness cable 2100. The second junction box 2200 may be connected to an AC impedance analyzer 2400 and a charge/discharge apparatus 2600 and serve as a medium for connecting the AC impedance analyzer 2400 and the charge/discharge apparatus 2600 to the battery 1200. For example, the second junction box 2200 may include a circuit configured to allow the AC impedance analyzer 2400 to detect an AC impedance. The harness cable 2100 is a passage for charging and discharging the battery 1200 or measuring the AC impedance.

Figure 3:
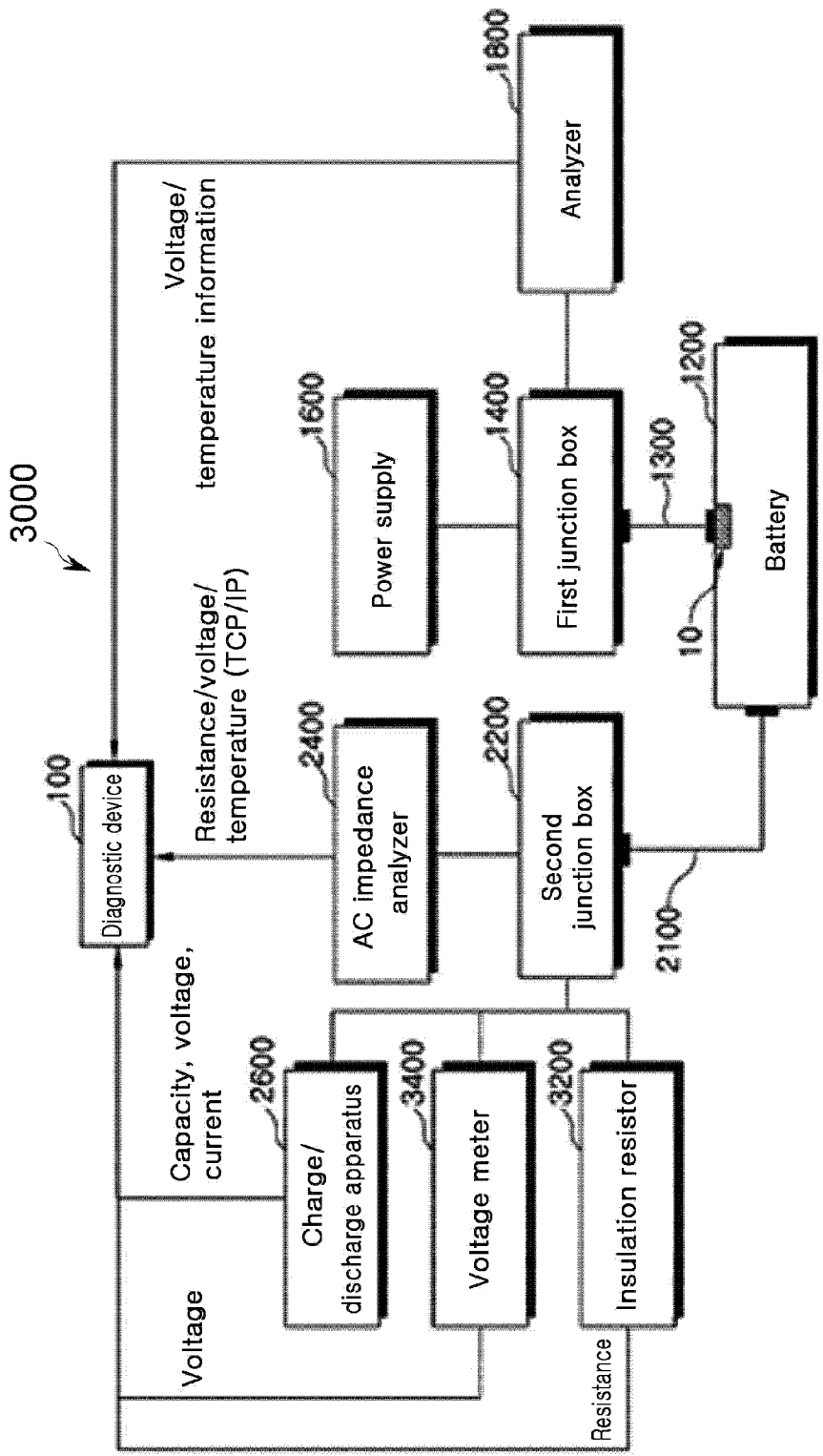
FIG. 3 is a detailed block diagram illustrating a system according to an embodiment.

FIG. 3 is a detailed block diagram illustrating a system for obtaining state information of a battery according to an embodiment.

Since a system 3000 of FIG. 3 represents a specific embodiment of the systems 1000 and 2000 described with reference to FIGS. 1 and 2, the description of the systems 1000 and 2000 of FIGS. 1 and 2 may also be applicable to the system 3000.

Referring to FIG. 3, the system 3000 may further include an insulation resistor 3200 and a voltage meter 3400. The insulation resistor 3200 and the voltage meter 3400 are configurations to ensure safety when state information of the battery 1200 is measured.

The insulation resistor 3200 may measure an insulation resistance of the battery 1200 through the second junction box 2200. For example, the insulation resistor 3200 may be connected to a (+) terminal, a (−) terminal, and a ground terminal of the second junction box 2200. The insulation resistor 3200 may be connected to either the (+) terminal or the (−) terminal of the battery 1200 and a body of the battery 1200 to measure an insulation resistance of the battery. Accordingly, since it is possible to check whether the body of the battery 1200 is insulated or not, an accident may be substantially prevented in which the user is electrocuted by a current flowing through the body of the battery 1200. The insulation resistor 3200 is not particularly limited as long as it is an element or device capable of measuring a resistance of the battery body. Information on the resistance of the battery 1200 measured by the insulation resistor 3200 may be transmitted to the diagnosis device 100.

The voltage meter 3400 may be connected to the battery 1200 through the second junction box 2200 to measure a voltage of the battery 1200. For example, the voltage meter 3400 may be connected to a (+) terminal and a (−) terminal of the second junction box 2200. The voltage meter 3400 may check a connection state between the second junction box 2200 and the battery 1200 and identify whether the battery 1200 is disconnected from MSD (Manual Service Disconnect) by measuring the voltage of the battery 1200. The MSD serves to shut off electrical connection of the battery 1200 in order to substantially prevent the user from electric shock during inspection or management. The voltage meter 3400 is connected to a terminal of the battery 1200 and measures a voltage of the battery 1200 to determine whether the battery 1200 is stably separated from the MSD, thereby ensuring safety. Information on the voltage of the battery 1200 measured by the voltage meter 3400 may be transmitted to the diagnosis device 100.

Figure 4:
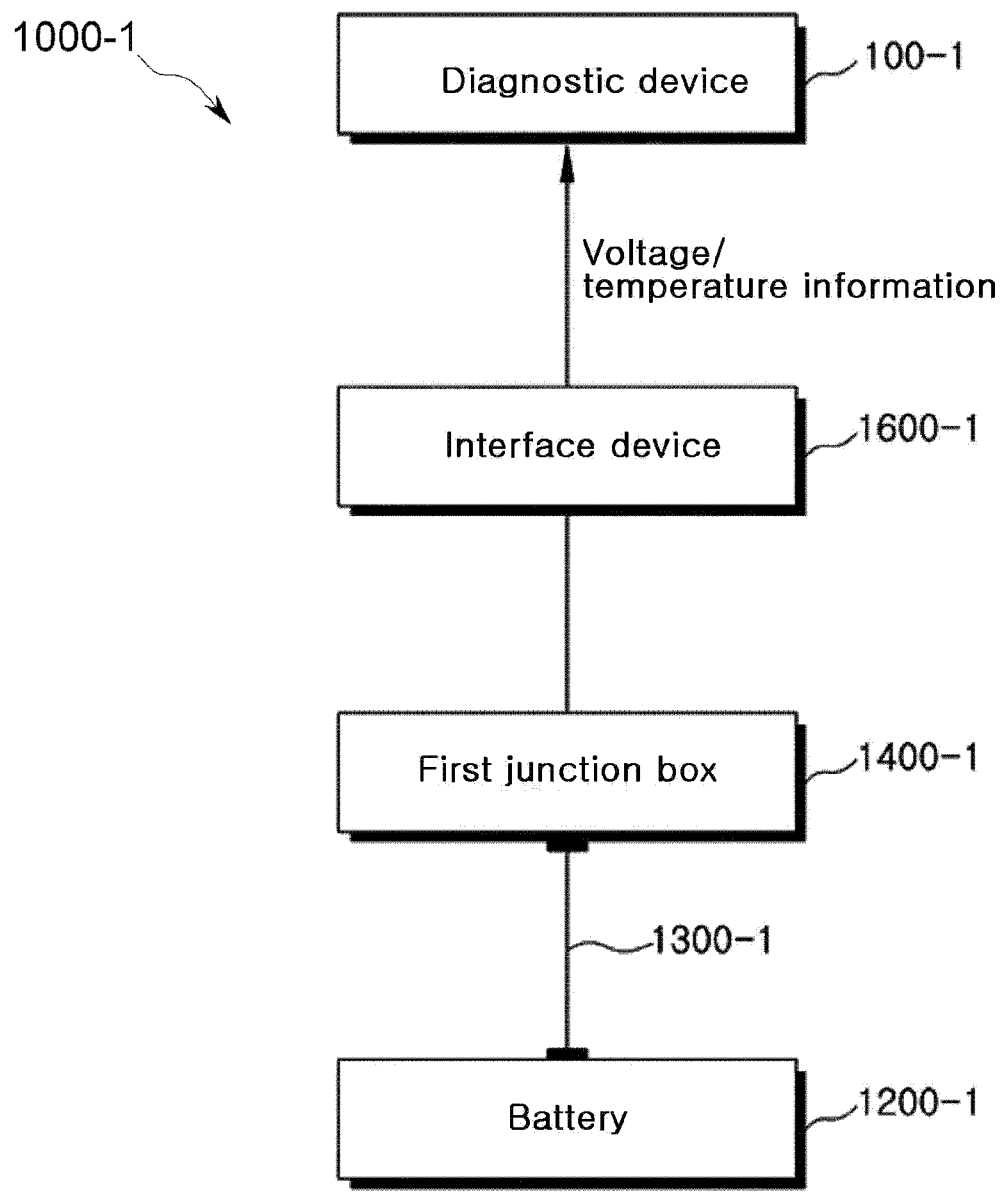
FIG. 4 is a block diagram illustrating a system according to another embodiment.

FIG. 4 is a block diagram illustrating a system for obtaining state information of a battery according to another embodiment of the present invention.

Referring to FIG. 4, a system 1000-1 may include a battery 1200-1, a first junction box 1400-1, and an interface device 1600-1.

The battery 1200-1 may refer to one battery cell or a module in which a plurality of battery cells are electrically connected to each other. In addition, the battery 1200-1 may include a plurality of battery modules. Each of the plurality of battery modules may include a plurality of cells. The plurality of battery modules may be connected mixedly in series and parallel. According to an embodiment, the plurality of battery modules may be secondary batteries such as lithium ion batteries. In addition, capacities of the plurality of battery modules may be substantially the same as or different from each other.

The battery 1200-1 may be a battery for an electric vehicle (EV). In such an embodiment, the battery 1200-1 may have a different shape, structure, number of cells, or a pin-map depending on the vehicle type. According to an embodiment, the battery 1200 may be composed of 6 modules, and each module may include 20 cells. According to another embodiment, the battery 1200 may be configured as one module including 20 cells, but embodiments of the present disclosure are not limited thereto.

According to an embodiment, the state information of the battery 1200-1 may include information on a voltage and a temperature of the battery 1200-1. According to an embodiment, the state information may include information on voltages of each of N number of battery cells of the battery 1200-1 and information on temperatures at M number of points (where N and M are positive integers). For example, the system 1000-1 may obtain voltage information of each of 120 battery cells and temperature information of 24 points.

According to an embodiment, the battery 1200-1 may include a battery management system (BMS) (not illustrated). The battery management system serves to improve energy efficiency and extend life span by optimally managing the battery 1200-1. For example, the battery management system may monitor voltage, current, and temperature of the battery 1200-1 in real time to substantially prevent excessive charging or discharging in advance and increase the safety and reliability of the battery 1200-1. The battery management system (BMS) is a device that measures voltage, current, and temperature in the battery 1200-1 and may serve to monitor state (or status) of the battery such as charge capacity and life and send a control signal to a switch to shut off power before a dangerous situation occurs due to overcharge, discharge, or voltage fluctuation. Accordingly, the battery management system (BMS) may manage various data (voltage, current, temperature, etc.) related to the state of the battery 1200-1.

The system 1000-1 may be useful when the battery management system (BMS) is not operated or is not available due to a failure or the like. For example, if data managed by the battery management system cannot be utilized because the protocol of the battery management system (BMS) is private or unavailable, the system 1000-1 may serve to measure the voltage and temperature of the battery 1200-1.

The first junction box 1400-1 may serve as a medium for stably connecting the battery 1200-1 and the interface device 1600-1 to each other. The first junction box 1400-1 may be connected to the battery 1200-1 through a harness cable 1300-1. The harness cable 1300-1 may be connected to the battery 1200-1 to transmit at least one signal indicating the obtained state information of the battery to the first junction box 1400-1.

One of opposite ends of the harness cable 1300-1 may include a first connector to be connected to a terminal of the battery 1200-1. The first connector may be designed with reference to a pin map of the battery 1200-1. For example, the first connector may be designed differently depending on a vehicle model in which the battery 1200-1 is used. The other end of the opposite ends of the harness cable 1300-1 may include a second connector to be connected to the first junction box 1400-1. A protective cap for safety may be attached to at least one of the first connector and the second connector. For example, a rubber cap for an electric vehicle may be attached to the first connector. In addition, a safety cap may be attached to the second connector connected to the first junction box 1400-1. The safety cap may be used for safe storage of the harness cable 1301-1 when the harness cable 1301-1 is not connected to the first junction box 1400-1.

The first junction box 1400-1 may output a signal received through the harness cable 1300-1 to the interface device 1600-1. The first junction box 1400-1 may include at least one fuse for protecting the interface device 1600-1 from a short circuit generated from a signal. Fuses may substantially prevent accidents by preventing excessive current from flowing. A signal received to the first junction box 1400-1 through the harness cable 1301-1 may pass through a fuse in the first junction box 1400-1 to be output to the interface device 1600-1.

The interface device 1600-1 may convert at least one signal received from the first junction box 1400-1 into at least one digital data and output the converted digital data to the outside. For example, the interface device 1600-1 may output the converted digital data to the outside through a predetermined communication protocol such as Wi-Fi, Bluetooth, Code Division Multiple Access (CDMA), and Control Area Network (CAN) protocol. For example, the interface device 1600-1 may output bit information indicating the voltage of the battery 1200-1 and bit information indicating the temperature to the external diagnosis device 100-1 based on the CAN protocol.

The interface device 1600-1 may include at least one microcontroller unit (MCU) for converting at least one signal received from the first junction box 1400-1 into digital data. According to an embodiment, the interface device 1600-1 may include at least one MCU in which an analog-digital converter (ADC) is embedded. In addition, the interface device 1600-1 may include a CAN communication member corresponding to a CAN communication network.

The diagnosis device 100-1 may determine life information of the battery, such as State of Charge (SoC), State of Health (SoH), State of Power (SoP), State of Energy (SoE), and State of Balance (SoB), based on digital data received from the interface device 1600-1. According to an embodiment, the diagnosis device 100-1 may include a memory (not illustrated) for storing program codes and algorithms for analyzing the digital data, and accordingly, may include at least one processor for executing a program or performing an algorithm.

Figure 5:
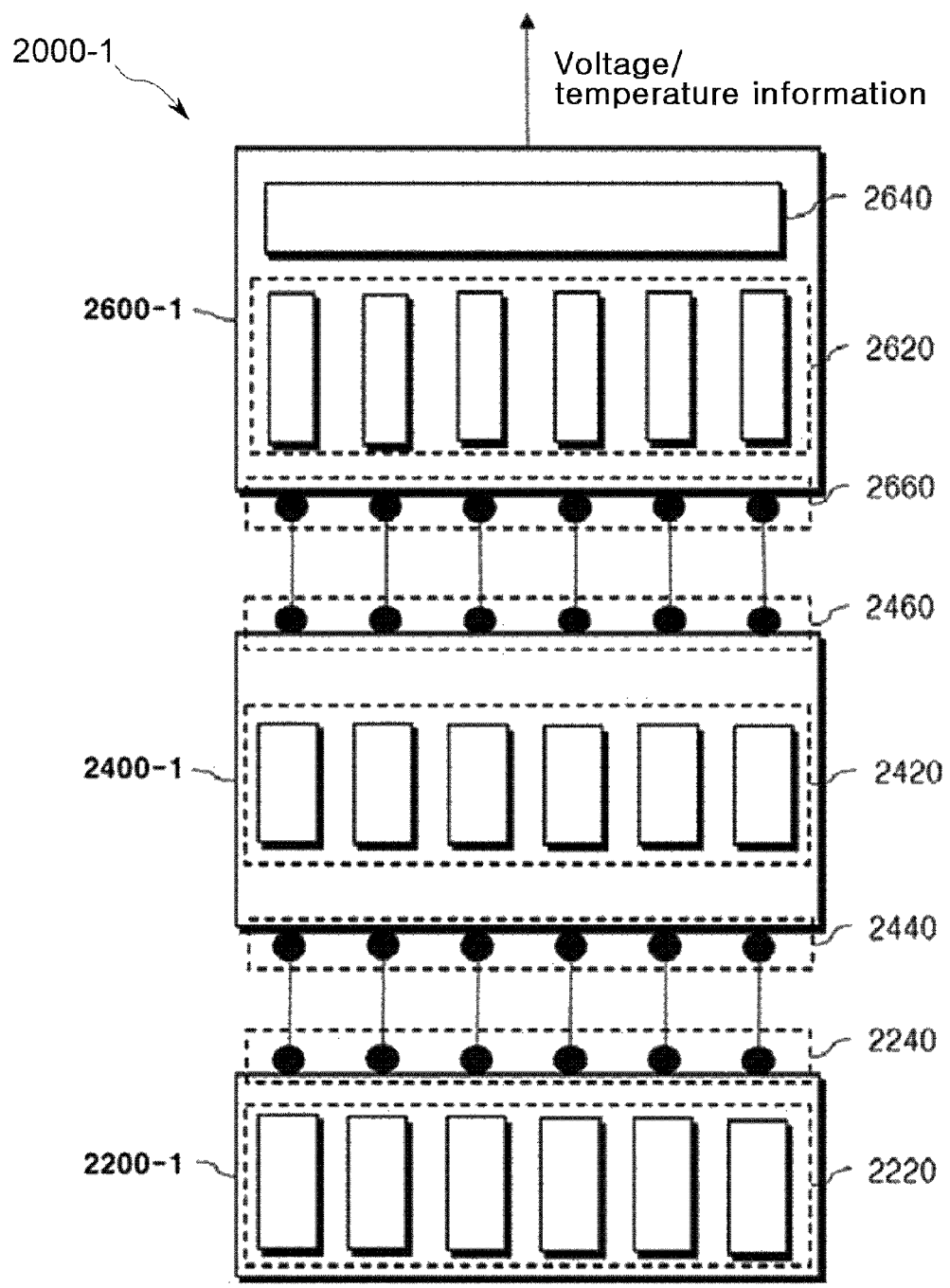
FIG. 5 is a detailed block diagram illustrating a system according to another embodiment.

FIG. 5 is a detailed block diagram illustrating a system according to another embodiment.

A system 2000-1 of FIG. 5 illustrates a detailed embodiment of the system 1000-1 of FIG. 4. Accordingly, although contents are omitted below, the description of the system 1000-1 of FIG. 4 may also be applicable to the system 2000-1 of FIG. 5.

Referring to FIG. 5, the system 2000-1 may include a battery 2200-1, a first junction box 2400-1, and an interface device 2600-1. The battery 2200-1, the first junction box 2400-1, and the interface device 2600-1 may correspond to the battery 1200-1, the first junction box 1400-1, and the interface device 1600-1 of FIG. 4, respectively.

The battery 2200-1 may include modules 2220. For example, the battery 2200-1 may include six modules 2220. One module may contain 20 cells.

The battery 2200-1 and the first junction box 2400-1 may be connected by a harness cable through a plurality of ports 2240 and 2440. For example, six output ports 2240 of the battery 2200-1 and six input ports 2440 of the first junction box 2400-1 may be connected to each other through a harness cable, respectively. The six output ports 2240 of the battery 2200-1 may correspond to the modules 2220, respectively, and state information on the modules 2220 may be output through the corresponding output ports 2240 and may pass through the harness cable to reach the input ports 2440 of the first junction box 2400-1.

Figure 6:
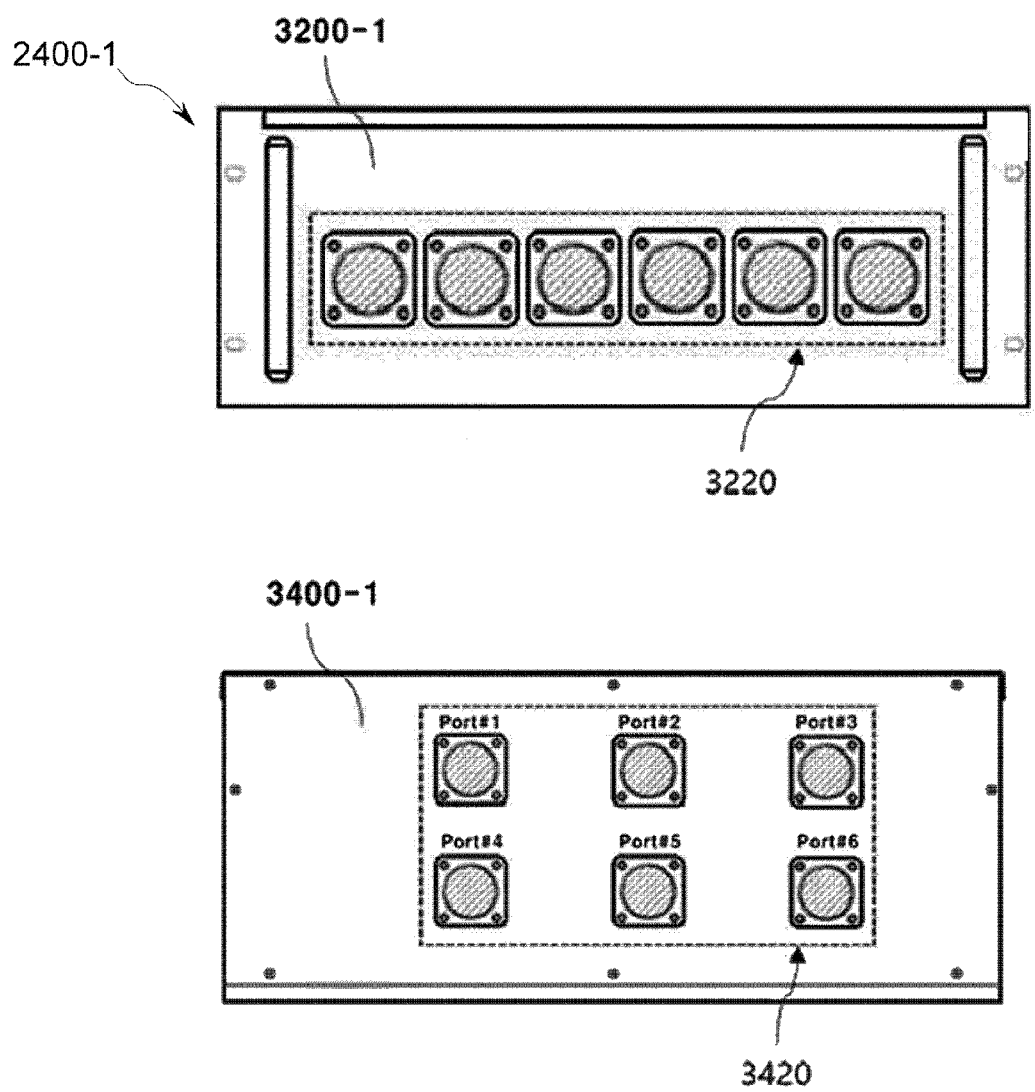
FIG. 6 illustrates one surface and another surface of a junction box according to another embodiment.
Figure 7:
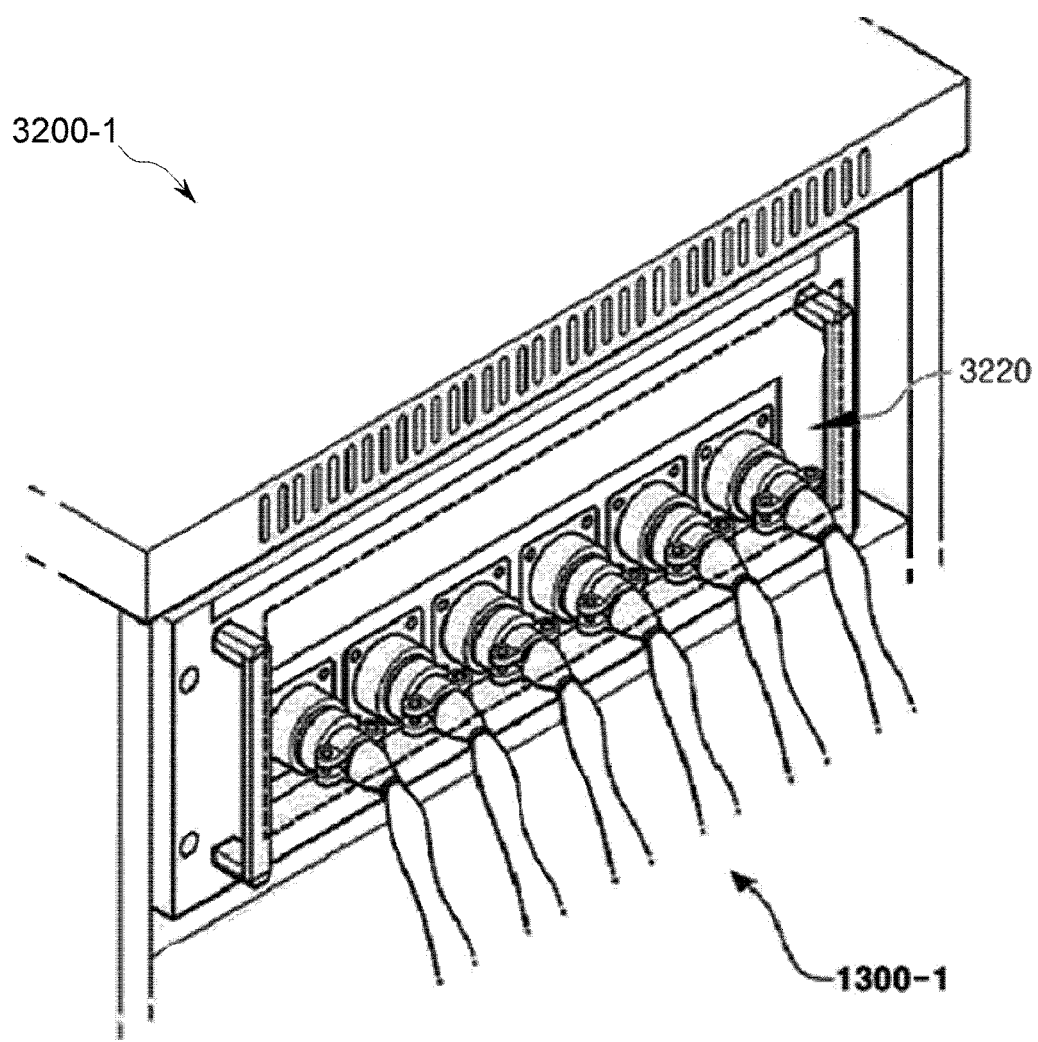
FIG. 7 illustrates connection of a harness cable to a junction box according to another embodiment.

Referring to FIG. 6, according to an embodiment, six ports 3220 may be positioned on one surface 3200-1 of the first junction box 2400-1. FIG. 7 illustrates six ports 3220 located on one surface 3200-1 of the first junction box 2400-1 and second connectors of the harness cable 1300-1 being connected to each other.

According to an embodiment, each of the ports may include 20 voltage channels through which voltage information is transmitted and 4 temperature channels through which temperature information is transmitted. For example, each of the voltage channels may be a channel for transmitting voltage information of one battery cell, and each of the temperature channels may be a channel for transmitting temperature information of one point.

Referring back to FIG. 5, the first junction box 2400-1 may include fuses 2420 through which signals received from the input ports 2440 pass. For example, the first junction box 2400-1 may include six input ports 2440 and six fuses 2420 corresponding to the six input ports 2440, respectively. Each of the fuses 2420 may protect the interface device 2600-1 from a short circuit that may be generated from a signal received by the first junction box 240-1. The first junction box 2400-1 may output a signal having passed through the fuses 2420 to the interface device 2600-1.

The first junction box 2400-1 and the interface device 2600-1 may be connected to each other by physical connection through a plurality of ports 2460 and 2660. For example, the first junction box 2400-1 may output a signal having passed through the fuses 2420 through the six output ports 2460. The interface device 2600-1 may receive the signal from the first junction box 2400-1 through the six input ports 2660. Referring to FIG. 6, six output ports 3420 may be included on another surface 3401-1 of the first junction box 2400-1. Signals may be transmitted to the interface device 2600-1 through the six output ports 3420.

Referring back to FIG. 5, the interface device 2600-1 may include slave MCUs 2620 and a master MCU 2640 for converting a received signal into digital data.

For example, the six slave MCUs 2620 may convert signals received from the six ports 2660 into digital data and transmit the converted digital data to the master MCU 2640. The master MCU 2640 may output the digital data to the diagnosis device 100-1 through a CAN protocol. To this end, the interface device 2600-1 may include a CAN communication member corresponding to a CAN communication network.

Figure 8:
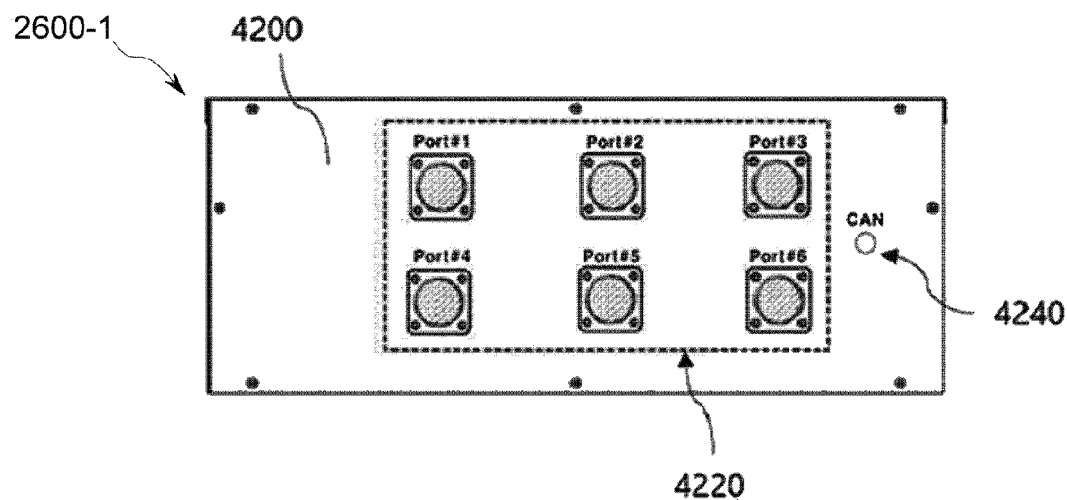
FIG. 8 illustrates one surface and another surface of an interface device according to another embodiment.
Figure 8:
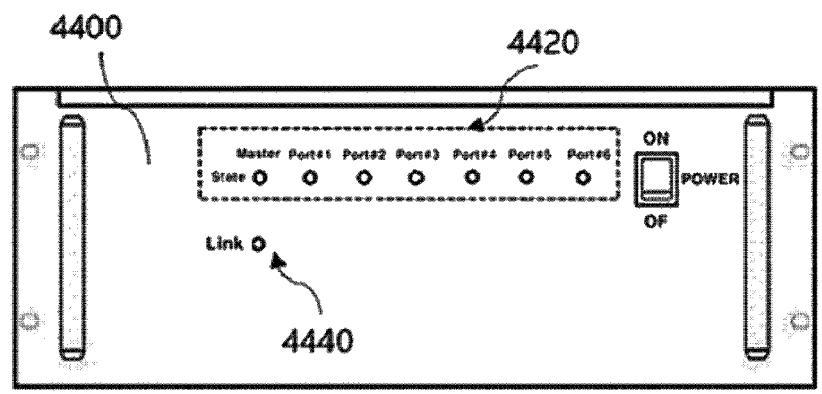

FIG. 8 illustrates one surface and another surface of an interface device according to another embodiment.

One surface 4200 of the interface device 2600-1 may include six input ports 4220 for receiving signals from the first junction box 2400-1 and a CAN port 4240 for performing CAN communication with the outside. The input ports 4220 may be respectively connected to the output ports 3420 of FIG. 6 and may respectively receive signals from the output ports 3420.

Another surface 4400 of the interface device 2600-1 may include, for each port, at least one LED 4420 indicating an operation state of the MCU (e.g., an operation state of an analog-digital converter) corresponding to each of the ports. For example, at least one LED 4420 may indicate the operation state of the master MCU or slave MCU described above with reference to FIG. 5. The LED 4420 may be turned on when the interface device 2601-1 is connected to the battery 2200-1 through the first junction box 240-1 using a harness cable.

Further, another surface 4400 of the interface device 2600-1 may include an LED 4440 which indicates a communication state based on a CAN protocol. For example, when CAN communication is normally performed, the LED 4440 may be turned on, and otherwise, the LED 4440 may be turned off. Another surface 4400 may include an additional port (not illustrated) for performing firmware update of the master MCU, but embodiments are not limited thereto.

Figure 9:
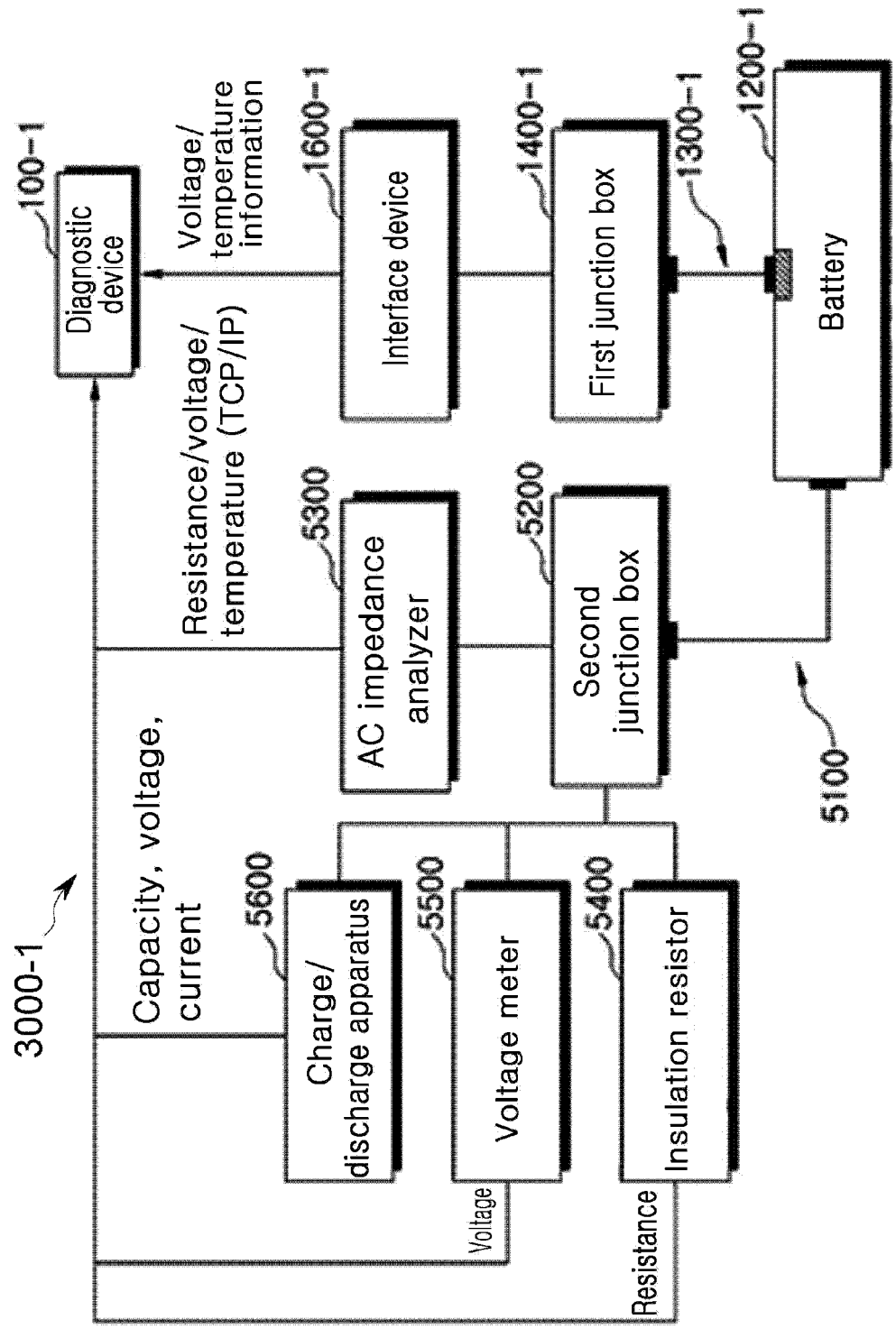
FIG. 9 illustrates a detailed block diagram illustrating a system according to another embodiment.

FIG. 9 illustrates a detailed block diagram illustrating a system according to another embodiment.

Since a system 3000-1 of FIG. 9 represents a specific embodiment of the systems 1000-1 and 2000-1 of FIGS. 4 and 5, the description of the systems 1000-1 and 2000-1 of FIGS. 4 and 5 may also be applicable to the system 3000-1 of FIG. 9.

Referring to FIG. 9, the system 3000-1 may further include a second junction box 5200, an AC impedance analyzer 5300, an insulation resistor 5400, a voltage meter 5500, and a charge/discharge apparatus 5600.

The AC impedance analyzer 5300 may detect an AC impedance of the battery 1200-1. For example, the AC impedance analyzer 5300 may be connected to a terminal of the battery 1200-1 through the second junction box 5200 to detect the AC impedance of the battery 1200-1.

The AC impedance analyzer 5300 may detect a battery AC impedance by measuring at least one of a resistance R, an inductance L, and a capacitance C of the battery 1200-1 at a reference frequency or within a reference frequency range. In such an embodiment, the AC impedance of the battery may be detected by measuring at least one of the resistance R, the inductance L and the capacitance C and then forming an equivalent circuit.

The AC impedance analyzer 5300 may include a configuration for measuring a resistance, an inductance, and a capacitance, and an operation processing circuit or apparatus for calculating an impedance value using the same. In addition, according to an embodiment, the AC impedance analyzer 5300 may further include a temperature measurer (not illustrated) that measures a temperature of the battery 1200-1. The AC impedance analyzer 5300 may measure the temperature of the battery 1200-1 through the temperature measurer (not illustrated) and detect the AC impedance in consideration of battery temperature dependence.

In one embodiment, when measured by the AC impedance analyzer 5300, a voltage may be in a range from 5 to 500 V, a resistance may be in a range from 100 $\mu\Omega$ to 1$\Omega$, a frequency may be in a range from 1 Hz to 1 kHz, and a temperature may be in a range from −40 to 80° C.

The AC impedance analyzer 5300 may detect the AC impedance of the battery 1200-1 in various states. Specifically, the AC impedance analyzer 5300 may detect an AC impedance for the battery in a fully charged state, an AC impedance for the battery in a fully discharged state, and an AC impedance for the battery in a partially charged and discharged state.

The charge/discharge apparatus 5600 may charge or discharge the battery 1200-1. The charge/discharge apparatus 5600 may charge or discharge the battery 1200-1 to make the battery 1200-1 in a fully charged state, a fully discharged state, or a partial charged state. According to an embodiment, the charge/discharge apparatus 5600 may further include a temperature measurer (not illustrated) that measures the temperature of the battery 1200-1. By measuring the temperature of the battery by the temperature measurer, the AC impedance analyzer 5300 may detect the AC impedance of the battery 1200-1 in various states in consideration of battery temperature dependence.

Information on the resistance R, inductance L, capacitance C, voltage, temperature, and AC impedance measured and detected by the AC impedance analyzer 5300 may be transmitted to the diagnosis device 100-1. According to an embodiment, the AC impedance analyzer 5300 may transmit battery state information to the diagnosis device 100-1 based on a Transmission Control Protocol/Internet Protocol (TCP/IP). According to an embodiment, the diagnosis device 100-1 may analyze the resistance R, the inductance L, the capacitance C, and the AC impedance received from the AC impedance analyzer 5300 to diagnose the state (or status) of the battery 1200-1 such as SoC, SoH, SoP, SoE, and SoB, and to this end, may include at least one processor.

The second junction box 5200 may be connected to the battery 1200-1 through a harness cable 5100. The second junction box 5200 may be connected to the AC impedance analyzer 5300 and the charge/discharge apparatus 5600 and serve as a medium for connecting the AC impedance analyzer 5300 and the charge/discharge apparatus 5600 to the battery 1200-1. For example, the second junction box 5200 may include a circuit configured to allow the AC impedance analyzer 5300 to detect an AC impedance. The harness cable 5100 is a passage for charging and discharging the battery 1200-1 or measuring the AC impedance.

The insulation resistor 5400 and the voltage meter 5500 are configured to ensure safety when obtaining state information of the battery 1200-1.

The insulation resistor 5400 is connected to the battery 1200-1 through the second junction box 5200 to measure an insulation resistance of the battery 1200-1. For example, the insulation resistor 5400 may be connected to a (+) terminal, a (−) terminal, and a ground terminal of the second junction box 5200. The insulation resistor 5400 may be connected to either the (+) terminal or the (−) terminal of the battery 1200-1 and a body of the battery 1200-1 to measure the insulation resistance of the battery. Accordingly, since it is possible to check whether the body of the battery 1200-1 is insulated or not, it is possible to substantially prevent an accident in which the user is electrocuted by a current flowing through the body of the battery 1200-1. The insulation resistor 5400 is not particularly limited as long as it is an element or device capable of measuring a resistance of the battery body. Information on the resistance of the battery 1200-1 measured by the insulation resistor 5400 may be transmitted to the diagnosis device 100.

The voltage meter 5500 may be connected to the battery 1200-1 through the second junction box 5200 to measure a voltage of the battery 1200-1. For example, the voltage meter 5500 may be connected to the (+) terminal and the (−) terminal of the second junction box 5200. The voltage meter 5500 may check a connection state between the second junction box 5200 and the battery 1200-1 and identify whether the battery 1200-1 is disconnected (e.g., separated) from the MSD (Manual Service Disconnect) by measuring the voltage of the battery 1200-1. The MSD serves to shut off electrical connection of the battery 1200-1 in order to substantially prevent the user from electric shock during inspection or management. The voltage meter 5500 is connected to a terminal of the battery 1200-1 and measures a voltage of the battery 1200-1 to determine whether the battery 1200-1 is stably separated from the MSD, thereby ensuring safety. Information on the voltage of the battery 1200-1 measured by the voltage meter 5500 may be transmitted to the diagnosis device 100.

The present invention is not limited by the above-described embodiments and the accompanying drawings but may be intended to be limited by the appended claims. Therefore, various types of substitutions, modifications and variations will be possible by those of ordinary skill in the art within the scope not departing from the technical spirit of the present invention described in the claims, and this also belongs to the scope of the present invention.

The invention claimed is:

1. A system for obtaining state information of a battery, the system comprising:
   at least one first harness cable configured to obtain data indicating state information of the battery from a battery management system of the battery;
   an analyzer configured to provide a driving signal for driving the battery management system;
   a first junction box configured to transmit the data input through the first harness cable to the analyzer;

a second junction box connected to the battery through at least one second harness cable; and an alternating current (AC) impedance analyzer configured to detect an AC impedance of the battery through the second junction box, wherein the analyzer is configured to output the data received from the first junction box to the outside and the second junction box comprises a circuit configured to detect the AC impedance.

2. The system of claim 1, further comprising a power supply connected to the first junction box to supply a power to the battery management system.

3. The system of claim 1, wherein the state information of the battery comprises at least one of voltage, temperature, state of charge (SoC), state of health (SoH), state of power (SoP), state of energy (SoE), and state of balance (SoB) of the battery.

4. The system of claim 1, wherein the AC impedance analyzer measures an AC impedance of the battery in a fully charged state, an AC impedance of the battery in a fully discharged state, and an AC impedance of the battery in a partially charged or partially discharged state.

5. The system of claim 1, wherein the AC impedance analyzer measures the AC impedance by measuring at least one of a resistance, an inductance, and a capacitance at a reference frequency or within a reference frequency range.

6. The system of claim 1, wherein the AC impedance analyzer measures the AC impedance by measuring at least one of a resistance, an inductance, and a capacitance at a reference frequency or within a reference frequency range, and configuring an equivalent circuit corresponding to the measured resistance, inductance, and capacitance.

7. The system of claim 1, further comprising a charge/discharge apparatus configured to charge or discharge the battery, wherein the charge/discharge apparatus is connected to the battery through the second junction box.

8. The system of claim 1, further comprising an insulation resistor configured to measure an insulation resistance of the battery, wherein the insulation resistor is connected to the battery through the second junction box.

9. The system of claim 1, further comprising a voltage meter configured to measure a voltage of the battery, wherein the voltage meter is connected to the battery through the second junction box.

10. The system of claim 1, wherein the first junction box comprises a temperature sensor configured to measure a temperature inside the first junction box.

11. The system of claim 10, wherein one end of the at least one first harness cable includes a first connector for connection with the battery and another end thereof includes a second connector for connection with the first junction box, and at least one of the first connector and the second connector is attached with a protective cap for safety.

12. A system for obtaining state information of a battery, the system comprising:

at least one first harness cable connected to the battery and configured to obtain at least one signal indicating the state information;

a first junction box comprising at least one fuse allowing the at least one signal input through the first harness cable to pass through, the first junction box configured to output the at least one signal having passed through the fuse;

an interface device configured to convert the at least one signal input from the first junction box into at least one digital data and output the at least one converted digital data to the outside;

a second junction box connected to the battery through at least one second harness cable; and an alternating current (AC) impedance analyzer configured to detect an AC impedance of the battery through the second junction box, wherein the second junction box comprises a circuit configured to detect the AC impedance.

13. The system of claim 12, wherein the state information includes at least one of voltage information and temperature information of the battery, and the signal includes at least one of a first signal indicating the voltage information and a second signal indicating the temperature information.

14. The system of claim 12, wherein the battery comprises a plurality of modules, and the at least one first harness cable comprises a plurality of harness cables configured to obtain a plurality of signals indicating the state information for the plurality of modules from the plurality of modules, respectively.

15. The system of claim 14, wherein the interface device comprises:

input ports configured to receive the plurality of signals from the first junction box, respectively; and at least one analog-digital converter configured to convert the plurality of signals into the at least one digital data, respectively.

16. The system of claim 15, wherein the interface device outputs the at least one digital data based on a control area network (CAN) protocol, the system further comprising:

a first LED indicating a communication state based on the CAN protocol; and a second LED indicating an operation state of the at least one analog-digital converter.

17. The system of claim 12, wherein the at least one fuse is configured to protect the interface device from a short circuit resulting from the at least one signal.

18. The system of claim 12, further comprising:

an insulation resistor configured to measure an insulation resistance of the battery; and a voltage meter configured to measure a voltage of the battery, wherein the insulation resistor and the voltage meter are connected to the battery through the second junction box.

* * * * *